United States Patent
Bissey et al.

(10) Patent No.: US 6,356,474 B1
(45) Date of Patent: Mar. 12, 2002

(54) EFFICIENT OPEN-ARRAY MEMORY DEVICE ARCHITECTURE AND METHOD

(75) Inventors: Lucien J. Bissey; Kevin G. Duesman, both of Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/733,242

(22) Filed: Dec. 7, 2000

(51) Int. Cl.7 .................................................. G11C 5/06
(52) U.S. Cl. ................ 365/63; 365/230.06; 365/189.08
(58) Field of Search .......................... 365/63, 196, 221, 365/230.06, 189.04, 189.08

(56) References Cited

U.S. PATENT DOCUMENTS

| | | | |
|---|---|---|---|
| 5,844,833 A | 12/1998 | Zagar et al. | 365/149 |
| 5,862,072 A | * 1/1999 | Raad et al. | 365/63 |
| 5,917,763 A | * 6/1999 | Mullarky | 365/200 |

* cited by examiner

*Primary Examiner*—David Nelms
*Assistant Examiner*—Thong Le
(74) *Attorney, Agent, or Firm*—Dorsey & Whitney LLP

(57) ABSTRACT

A memory device has an open-array architecture that includes alternate digit lines in the end subarrays that are not normally coupled to a sense amplifier. These digit lines are not normally coupled to a sense amplifier because there is no adjacent subarray containing digit lines that could be coupled to the other input of the sense amplifier. A sense amplifier is provided for each of these normally unused digit lines, and each normally unused digit line is coupled to one of the imports of a respective sense amplifier. The other input of each sense amplifier is coupled to a dummy load that is provided to simulate the resistance and capacitance of an actual digit line. The dummy load has a capacitance that may be adjusted so that the capacitance at both inputs to each sense amplifier are substantially equal. As a result, normally unused digit lines in the end subarray of a memory array, as well as the memory cells coupled to the digit lines, may be used.

54 Claims, 5 Drawing Sheets

US 6,356,474 B1

EFFICIENT OPEN-ARRAY MEMORY DEVICE ARCHITECTURE AND METHOD

TECHNICAL FIELD

This invention relates to memory devices, and, more particularly, to memory devices employing an open-array architecture.

BACKGROUND OF THE INVENTION

Memory devices, such as dynamic random access memories ("DRAMs"), include one or more arrays of memory cells arranged in rows and columns. Each array may be divided into several sub-arrays. Typically, one or more digit or "bit" lines are provided for each column of the array, and each digit line is coupled to a respective sense amplifier. Each sense amplifier is generally a differential amplifier that compares the voltage at one of its inputs to the voltage at the other of its inputs. The sense amplifier then drives its inputs to complementary logic levels corresponding to the sensed differential voltage.

There are currently two array architectures that are commonly used in memory devices, such as DRAMs. In an "open-array" architecture, the digit lines span two adjacent subarrays, and each digit line is coupled to each memory cell in a respective column. A sense amplifier is coupled to the digit lines of two adjacent subarrays. Thus, each sense amplifier is shared by two subarrays so that one input to the sense amplifier is coupled to the digit line of one array and the other input to the sense amplifier is coupled to the digit line of the other array. Prior to a memory read operation, the digit lines are precharged to a voltage that is typically one-half the supply voltage, a voltage known as DVC2.

In response to a memory read operation, one of the digit lines coupled to a sense amplifier is coupled to a memory cell being read. In response, the voltage on the digit line either increases or decreases from DVC2 depending upon the logic level stored in the memory cell. The other digit line remains at the precharge voltage, DVC2. The sense amplifier detects that the voltage on the digit line coupled to the memory cell being read has either increased or decreased relative to the precharge voltage and then drives the digit lines to complimentary logic levels corresponding to the sensed voltage.

The other architecture that is commonly used in memory device arrays is the folded digit line architecture. In a folded digit line architecture, each column is provided with a pair of complimentary digit lines, and the digit lines of each pair are generally coupled to alternate memory cells in the same subarray. The complimentary digit lines are coupled to the inputs of a respective sense amplifier. Thus, the digit lines coupled to each sense amplifier are from the same subarray.

A memory read operation in a folded digit line architecture is essentially the same as in an open-array architecture. More specifically, the digit lines of each column are initially precharged to DVC2. In response to a memory read command, one of the digit lines coupled to the sense amplifier is coupled to a memory cell being read. In response, the voltage on the digit line either increases or decreases depending upon the logic level stored in the memory cell. The other digit line remains at the precharge voltage. The sense amplifier detects that the voltage on the digit line coupled to the memory cell being read has either increased or decreased relative to the precharge voltage. The sense amplifier then drives both digit lines to complementary logic levels corresponding to the sensed voltage.

Each of the above-described architectures has its advantages and disadvantages. A disadvantage of the open-array architecture relative to the folded digit line architecture is that it is susceptible to errors resulting from noise because each sense amplifier input is coupled to a different array. In contrast, since both digit lines coupled to a sense amplifier in a folded digit line architecture extend closely adjacent each other through the same array, they tend to pick up the same noise signals. The differential operation of the sense amplifiers thus makes them insensitive to these common mode noise signals.

Although folded digit line architectures have better noise immunity, they have a significant disadvantage compared to open-array architectures in that they are less efficient. Due to the nature of the layout of a folded architecture, each memory cell occupies $8F^2$ in area, where "F" is the minimum feature size of the semiconductor process. The layout of an open array architecture allows for a $6F^2$ cell area, thereby resulting in a 25% reduction over the $6F^2$ cell. Thus, open-array architectures are theoretically substantially more efficient than folded digit line architectures in using the surface area of a semiconductor die.

In practice, the theoretical efficiency of an open-array architecture is not achieved because the digit lines, and memory cells to which they are coupled, remain unused for reasons that will be explained with reference to FIG. 1. As shown in FIG. 1, a memory array 10 having a typical open-array architecture includes a plurality of sub arrays 12, 14, 15 . . . N. Positioned between each subarray is a set of sense amplifiers 30, 32, 34 . . . M, one of which is provided for each column of the subarrays. Each of the sense amplifiers 30-M has a differential input. As explained previously, each sense amplifier 30-M is coupled to a digit line D of one sub array and to a digit line D of an adjacent subarray. Thus, each sense amplifier 30-M is shared by adjacent subarrays 12-N. (It will be understood that FIG. 1 shows only a portion of the array 10, which could include a greater or lesser number of subarrays and columns than shown therein.)

As mentioned previously, in an open-array architecture, each sense amplifier is shared by digit lines in adjacent arrays. However, there is no adjacent array for alternate digit lines in the end array N. As a result, there are no adjacent array digit lines that could be coupled to a sense amplifier coupled to alternate digit lines in the end array N. As a result, these "orphaned" digit lines 50, as well as the memory cells (not shown) coupled to these digit lines 50, remain unused. The inability to use orphaned digit lines in the end subarrays of an open-array architecture reduces the actual efficiency of such architectures from the theoretical efficiency that might otherwise be achieved.

There is therefore a need for a more efficient open-array architecture so that close to the theoretical efficiency of an open-array architectures may be achieved.

SUMMARY OF THE INVENTION

A memory array includes a plurality of memory cells, sense amplifiers and digit lines. The memory array has an open-array architecture in which each digit line in the array, except for a set of digit lines at an end of the array, is coupled to a first input of a respective sense amplifier, and a second input of each sense amplifier is coupled to an adjacent digit line. A set of digit lines at the end of the array is coupled to one input of a second plurality of respective sense amplifiers. A second input of each of the sense amplifiers in the second plurality is coupled to a respective load circuit. Each load circuit has an impedance that may be adjusted so that the capacitance at the second input of each sense amplifier is substantially equal to the capacitance at the first input of the sense amplifier. The array may be divided into a plurality of sub-arrays, with the digit lines at the end of the array being in an end sub-array. The array is preferably used in a dynamic random access memory device, and such memory device may be used in a computer system.

DETAILED DESCRIPTION OF THE INVENTION

Figure 1:
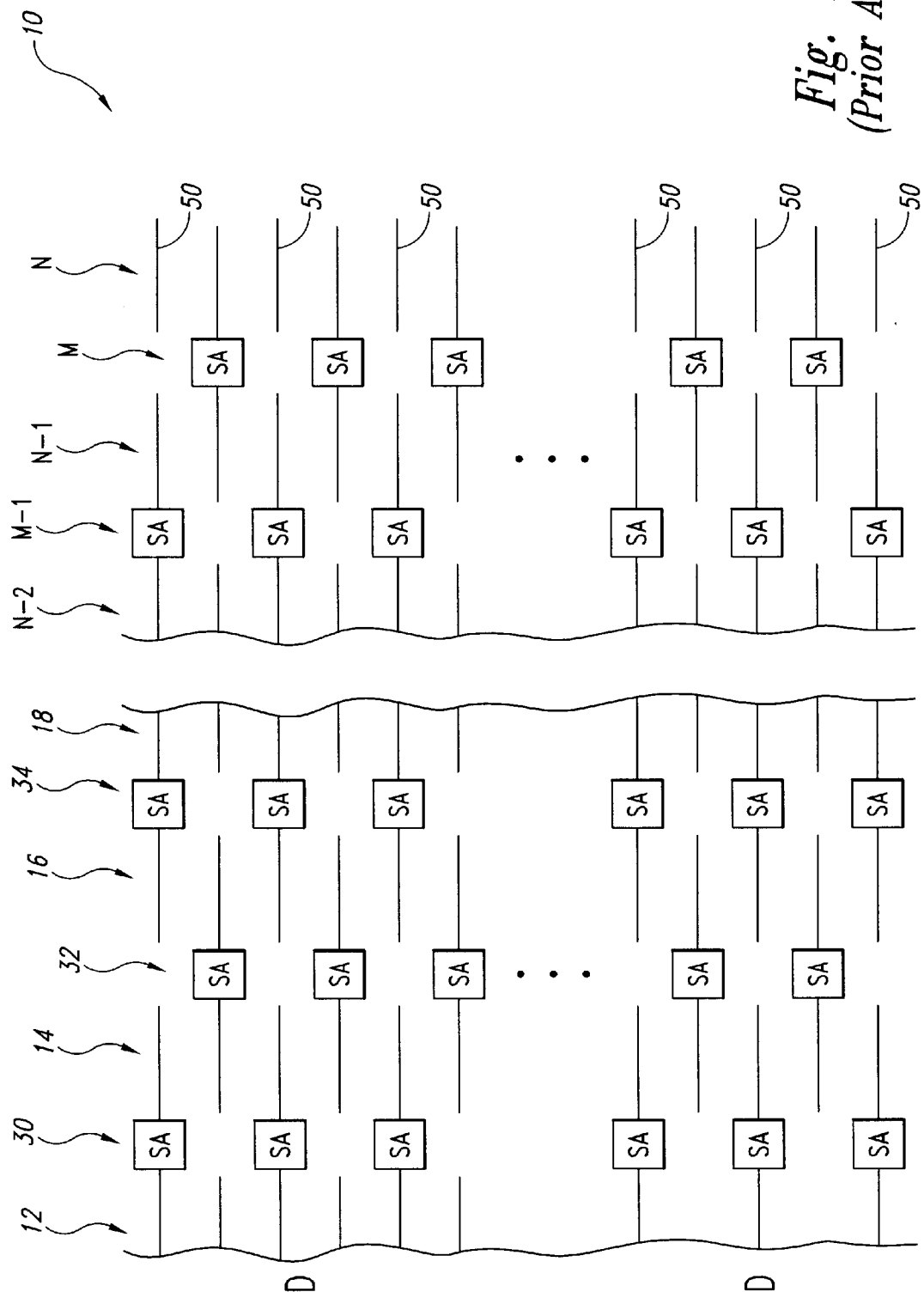
FIG. 1 is a block diagram of a memory array employing a conventional open-array architecture.
Figure 2:
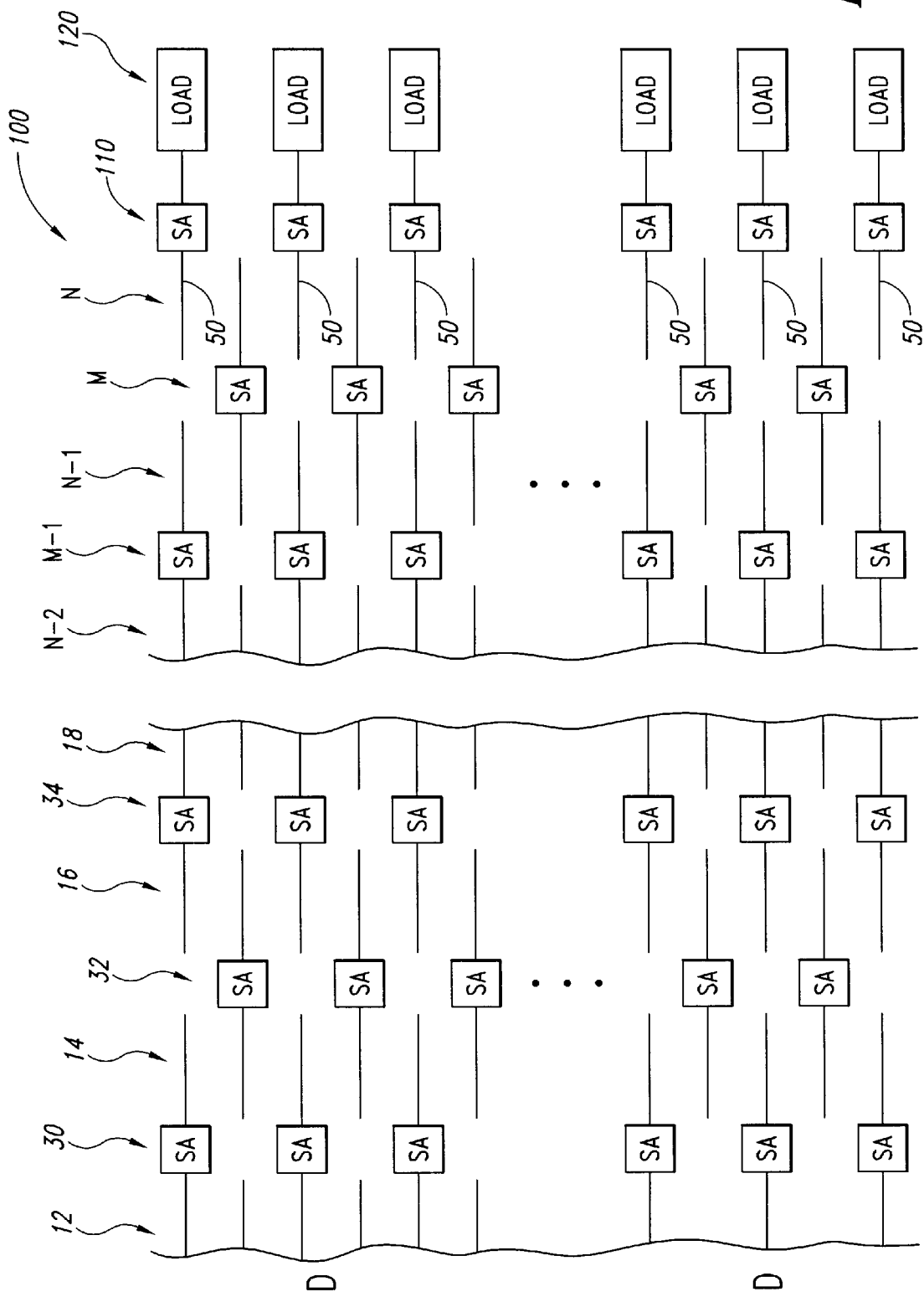
FIG. 2 is a block diagram of a memory array employing a more efficient open-array architecture in accordance with one-embodiment of the invention.

A memory array 100 employing an open-array architecture in accordance with one embodiment of the invention is illustrated in FIG. 2. The memory array 100 uses most of the same components that are used in the memory array 10 of FIG. 1. Therefore, in the interests of clarity and brevity, these components have been provided with the same reference numerals, and an explanation of their operation will not be repeated. The memory array 100 differs from the conventional memory array 10 shown in FIG. 1 by providing a sense amplifier 110 for each "orphaned" digit line 50 in the end subarray N. However, since the sense amplifiers 110 require a differential input, a "dummy" load 120 is coupled to the other input of each sense amplifier 110. Although fixed, i.e., non-adjustable dummy loads have been used in the past in the manner illustrated in FIG. 2, the dummy load 120 has an adjustable impedance. More specifically, the impedance of the dummy load 120 may be adjusted as explained below so that it has approximately the same output impedance (resistance and capacitance) as an actual digit line. Thus, the dummy load 120 accurately simulates a digit line that can be precharged to DVC2. As a result, each sense amplifier 110 functions essentially like if it was coupled to the digit lines of adjacent arrays in the same manner as the other sense amplifiers 30 through M-1.

Although the memory array 100 adds to the memory array 10 a sense amplifier 110 and dummy load 120 for each column, it is nevertheless far more efficient than the memory array 10. This efficiency is achieved because each sense amplifier 110 requires essentially only three transistors, and each dummy load 120 can also be implemented with relatively few components. By making the orphaned digit lines 50 usable, the access transistors (not shown) and memory cells (not shown) that are coupled to the digit lines 50 become usable. These transistors and memory cells may number in the hundreds so that, even with the additional components of the sense amplifier 110 and the dummy load 120, there is still a great increase in the efficiency of using the area of a semiconductor die (not shown) on which the array 100 is formed.

Figure 3:
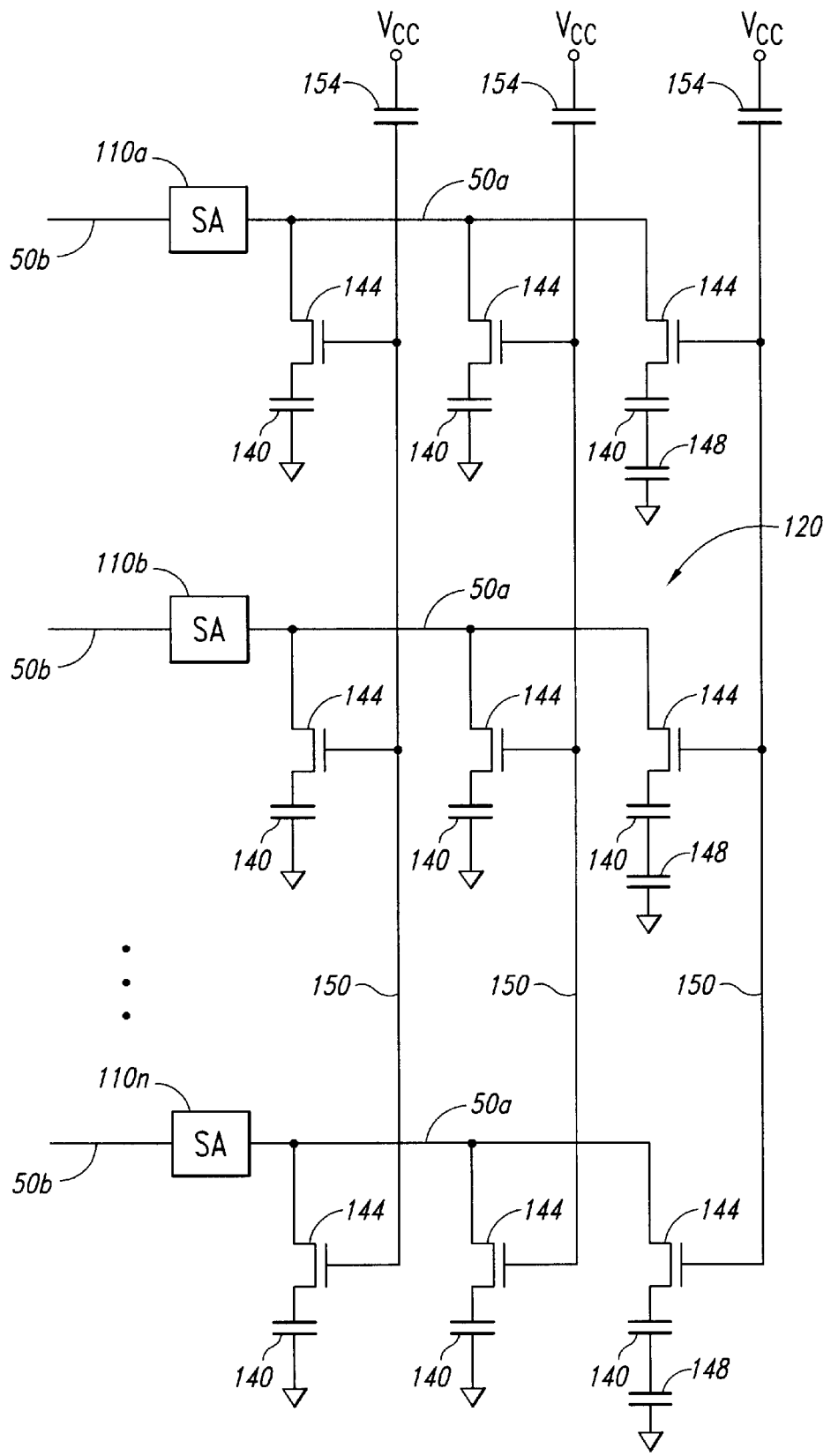
FIG. 3 is a schematic and block diagram showing one embodiment of a load circuit that may be used in the memory array of FIG. 2.

One embodiment of an adjustable dummy load 120 is shown in FIG. 3, it being understood that other circuits may alternatively be used. The adjustable dummy load 120 includes 3 capacitors 140 coupled to each sense amplifier 110a–n through respective access transistors 144. The capacitor 140 coupled to the transistor 144 at each end is connected in series with a second transistor 148 so that the capacitance of the series combination of the capacitors 140, 148 is substantially less than, preferably one-half of, the capacitance of the capacitor 140 alone. The gates of all transistors 144 occupying the same relative position a coupled to a common line 150. Each of the lines 150 is coupled to a reference voltage, such as the supply voltage $V_{CC}$, through a respective antifuse 154.

In operation, the capacitance of each digit line 50a may be adjusted by selectively blowing each antifuse 154, thereby turning ON the NMOS transistors 144 coupled to the antifuse 154. As each transistor 154 is turned ON, it couples a capacitor 140 (or two capacitors 140, 148 in series, in the case of the end transistor 144) to its respective digit line 50a, thereby altering the impedance of the digit line 50a. The number of antifuses 154 that should be blown is preferably determined by testing the memory device while examining the change in voltage in both digit lines 50a,b during a read memory access. The capacitance of the digit lines 50a should be adjusted as explained above so that the voltages on the digit lines 50a,b change at the same rate. If the voltage on the digit lines 50a change faster than the voltage on the digit line 50b, then antifuses 154 should be blown until sufficient capacitance has been added to the digit lines 50a that the voltages on both lines 50a,b change at the same rate.

After the antifuses 154 have been correctly blown, a memory array 100 containing the array is used in normal operation. In normal operation, the capacitors 140, 148 are precharged through the respective access transistors 144 by the sense amplifiers 110a–n in the same manner that digit lines are normally precharged by the sense amplifiers 110a–n. Thus, the dummy load 120 subsequently supplies DVC2 to the sense amplifiers 110a–n with the same output impedance as an actual digit line thus allowing the sense amplifiers 110a–n to sense the voltage on the digit lines 50b.

Although the dummy load 120 is shown in FIG. 3 as a discrete circuit, it may actually be implemented using a few extra wordlines, access transistors, and memory cell capacitors that are identical to wordlines, access transistors and memory cell capacitors used in other arrays 100. More specifically, each line 150 may be a wordline exactly like the wordlines used in the arrays 100, the transistors 144 may be access transistors exactly like the access transistors used in the arrays 100, and the capacitors 140 may be capacitors exactly like the memory cell capacitors used in the arrays, except that only one capacitor 140 would then be coupled to an end transistor.

Figure 4:
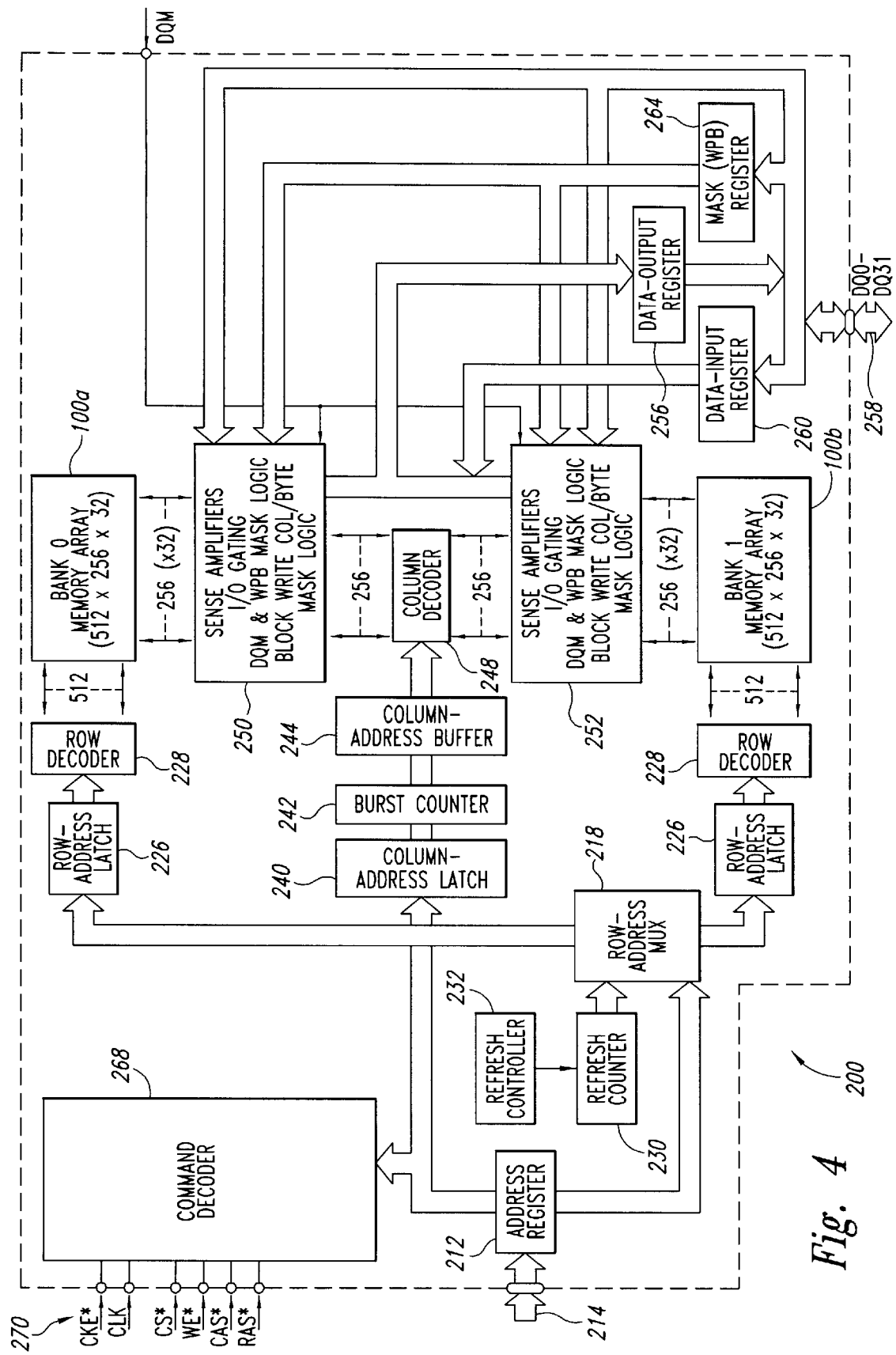
FIG. 4 is a block diagram of a memory device using the memory array of FIG. 2.

One embodiment of a memory device using the memory array 100 shown in FIG. 2 is shown in FIG. 4. The memory device shown in FIG. 4 is synchronous dynamic random access memory ("SDRAM") 200, although the memory array 100 of FIG. 2 may be used in other DRAMs and other memory devices. The SDRAM 200 includes an address register 212 that receives either a row address or a column address on an address bus 214. The address bus 214 is generally coupled to a memory controller (not shown in FIG. 1). Typically, a row address is initially received by the address register 212 and applied to a row address multiplexer 218. The row address multiplexer 218 couples the row address to a number of components associated with either of two memory arrays 100a, 100b, depending upon the state of a bank address bit forming part of the row address. As mentioned above, the memory arrays 100a, 100b have an open-array architecture incorporating one embodiment of the invention as shown in FIG. 2. Associated with each of the memory arrays 100a, 100b is a respective row address latch 226, which stores the row address, and a row decoder 228, which applies various signals to its respective memory array 100a or 100b as a function of the stored row address. The row address multiplexer 218 also couples row addresses to the row address latches 226 for the purpose of refreshing the memory cells in the memory arrays 100a, 100b. The row addresses are generated for refresh purposes by a refresh counter 230, which is controlled by a refresh controller 232.

After the row address has been applied to the address register 212 and stored in one of the row address latches 226, a column address is applied to the address register 212. The address register 212 couples the column address to a column address latch 240. Depending on the operating mode of the SDRAM 200, the column address is either coupled through a burst counter 242 to a column address buffer 244, or to the burst counter 242, which applies a sequence of column addresses to the column address buffer 244 starting at the column address that is stored in the column-address latch. In either case, the column address buffer 244 applies a column address to a column decoder 248, which applies various column signals to respective sense amplifiers and associated column circuitry 250, 252 for the respective memory arrays 100a, 100b.

Data to be read from one of the memory arrays 100a, 100b are coupled to the column circuitry 250, 252 for one of the memory arrays 100a, 100b, respectively. The data are then coupled to a data output register 256, which applies the data to a data bus 258. Data to be written to one of the memory arrays 100a, 100b are coupled from the data bus 258 through a data input register 260 to the column circuitry 250, 252 and then are transferred to one of the memory arrays 100a, 100b, respectively. A mask register 264 may be used to selectively alter the flow of data into and out of the column circuitry 250, 252, such as by selectively masking data to be read from the memory arrays 100a, 100b.

The above-described operation of the SDRAM 200 is controlled by a command decoder 268 responsive to high level command signals received on a control bus 270. These high level command signals, which are typically generated by a memory controller (not shown in FIG. 4), are a clock enable signal CKE*, a clock signal CLK, a chip select signal CS*, a write enable signal WE*, a column address strobe signal CAS*, and a row address strobe signal RAS*, with the "*" designating the signal as active low or complement. The command decoder 268 generates a sequence of control signals responsive to the high level command signals to carry out the function (e.g., a read or a write) designated by each of the high level command signals. These control signals, and the manner in which they accomplish their respective functions, are conventional. Therefore, in the interest of brevity, a further explanation of these control signals will be omitted.

Figure 5:
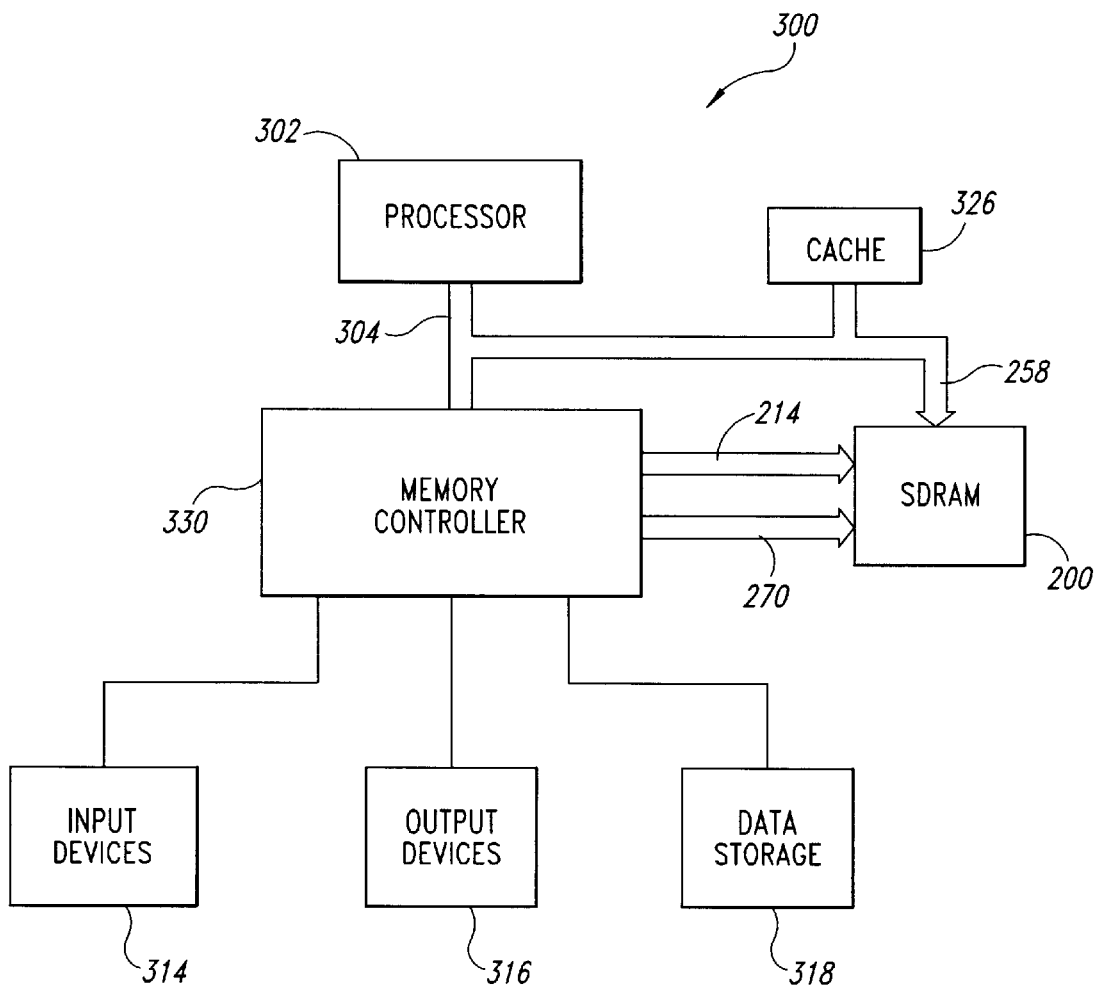
FIG. 5 is a block diagram of a computer system using the memory device of FIG. 4.

One embodiment of a computer system 300 using the SDRAM 200 shown in FIG. 4 is shown in FIG. 5. The computer system 300 includes a processor 302 for performing various computing functions, such as executing specific software to perform specific calculations or tasks. The processor 302 includes a processor bus 304 that normally includes the address bus 214, the data bus 258, and the control bus 270 (FIG. 4). In addition, the computer system 300 includes one or more input devices 314, such as a keyboard or a mouse, coupled to the processor 302 to allow an operator to interface with the computer system 300. Typically, the computer system 300 also includes one or more output devices 316 coupled to the processor 302, such output devices typically being a printer or a video terminal. One or more data storage devices 318 are also typically coupled to the processor 302 to allow the processor 302 to store data or retrieve data from internal or external storage media (not shown). Examples of typical storage devices 318 include hard and floppy disks, tape cassettes and compact disk read-only memories (CD-ROMs). The processor 302 is also typically coupled to cache memory 326, which is usually static random access memory ("SRAM") and to the SDRAM 200 through a memory controller 330. The memory controller 330 normally includes the control bus 270 and the address bus 214 that is coupled to the SDRAM 200. The data bus 258 may be coupled to the processor bus 304 either directly (as shown), through the memory controller 330, or by some other means.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A memory array comprising:
   a plurality of sub-arrays, each sub array including a plurality of memory cells arranged in rows and columns;
   a digit line for each column of each sub-array;
   a plurality of sense amplifiers, the digit lines and sense amplifiers being arranged in an open-array architecture so that each of a first plurality of sense amplifiers is coupled to a digit line in each of two adjacent sub-arrays except for a first set of digit lines in at least one end sub-array;
   a second plurality of sense amplifiers each having first and second complimentary inputs, the digit lines in the first set being coupled to the first input of a respective sense amplifier in the second plurality of sense amplifiers; and
   a load circuit coupled to the second input of each sense amplifier in the second plurality, the load circuit having an adjustable impedance.

2. The memory array of claim 1 wherein the load circuit comprises a circuit having an input terminal with an adjustable capacitance.

3. The memory array of claim 1 wherein the load circuit comprises a plurality of capacitors.

4. The memory array of claim 3 wherein each of the capacitors is coupled to the second input of each sense amplifier by a respective MOSFET transistor.

5. The memory array of claim 3 wherein each of the capacitors comprise a memory cell capacitor.

6. The memory array of claim 3 wherein plurality of MOSFETs coupled to respective ones of the capacitors have respective control terminals that are coupled to each other.

7. The memory array of claim 1 wherein the load circuit comprises a plurality of series circuits connected in parallel with each other, each of the series circuits comprising a transistor in series with a capacitive device.

8. The memory array of claim 1 wherein the load circuits comprise:
   a plurality of access transistors coupled to the second input of each sense amplifier in the second plurality;
   a plurality of word lines, each of the word lines being coupled to the gates of a plurality of correspondingly positioned access transistors for a plurality of sense amplifiers;

a memory cell capacitor coupled to each of the access transistors so that the memory cell capacitor is coupled to one of the sense amplifiers when the transistor is conductive; and a control circuit for applying a signal to one or a plurality of word lines to couple one or a plurality of the memory cell capacitors to the second input of each sense amplifier in the second plurality.

9. A memory array comprising:

a first plurality of sense amplifiers and digit lines arranged in an open array architecture, each digit line in the array except for a set of digit lines at an end of the array being coupled to a first input of a respective sense amplifier, a second input of the sense amplifier being coupled to an adjacent digit line;

a plurality of adjustable load circuits; and a second plurality of sense amplifiers each having a first input coupled to a respective one of the digit lines at the end of the array and a second input coupled to a respective one of the load circuits.

10. The memory array of claim 9 wherein each of the adjustable load circuits comprises a circuit having an input terminal with an adjustable capacitance.

11. The memory array of claim 9 wherein each of the load circuits comprises a plurality of capacitors.

12. The memory array of claim 9 wherein each of the capacitors is coupled to the second input of each sense amplifier by a respective MOSFET transistor.

13. The memory array of claim 11 wherein each of the capacitors comprises a memory cell capacitor.

14. The memory device of claim 13 wherein a plurality of MOSFETs coupled to respective ones of the capacitors have respective control terminals that are coupled to each other.

15. The memory array of claim 9 wherein each of the load circuits comprises a plurality of series circuits connected in parallel with each other, each of the series circuits comprising a transistor in series with a capacitive device.

16. The memory array of claim 9 wherein the load circuits comprise:

a plurality of access transistors coupled to the second input of each sense amplifier in the second plurality;

a plurality of word lines, each of the word lines being coupled to the gates of a plurality of correspondingly positioned access transistors for a plurality of sense amplifiers;

a memory cell capacitor coupled to each of the access transistors so that the memory cell capacitor is coupled to one of the sense amplifiers when the transistor is conductive; and a control circuit for applying a signal to one or a plurality of word lines to couple one or a plurality of the memory cell capacitors to the second input of each sense amplifier in the second plurality.

17. A memory device comprising:

a memory array having a plurality of sub-arrays, each sub array including a plurality of memory cells arranged in rows and columns;

a digit line for each column of each sub-array;

a plurality of sense amplifiers, the digit lines and sense amplifiers being arranged in an open-array architecture so that each of a first plurality of sense amplifiers is coupled to a digit line in each of two adjacent sub-arrays except for a first set of digit lines in at least one end sub-array;

a second plurality of sense amplifiers each having first and second complimentary inputs, the digit lines in the first set being coupled to the first input of a respective sense amplifier in the second plurality of sense amplifiers;

a load circuit coupled to the second input of each sense amplifier in the second plurality of sense amplifiers, the load circuit having an adjustable impedance;

an address decoder receiving a memory address at an external terminal, the address decoder being operable to activate a row and column in the array corresponding to the memory address; and a data path operable to couple read data from an external terminal to the memory array and write data from the memory array to the external terminal.

18. The memory device of claim 17 wherein the load circuit comprises a circuit having an input terminal with an adjustable capacitance.

19. The memory device of claim 17 wherein the load circuit comprises a plurality of capacitors.

20. The memory device of claim 19 wherein each of the capacitors is coupled to the second input of each sense amplifier by a respective MOSFET transistor.

21. The memory device of claim 19 wherein the capacitors comprise a memory cell capacitor.

22. The memory device of claim 19 wherein plurality of MOSFETs coupled to respective ones of the capacitors have respective control terminals that are coupled to each other.

23. The memory device of claim 17 wherein the load circuit comprises a plurality of series circuits connected in parallel with each other, each of the series circuits comprising a transistor in series with a capacitive device.

24. The memory device of claim 17 wherein the memory device comprises a dynamic random access memory.

25. The memory device of claim 24 wherein the dynamic random access memory device comprises a synchronous dynamic random access memory.

26. A memory device comprising:

a memory array comprising:

a first plurality of sense amplifiers and digit lines arranged in an open array architecture, each digit line in the array except for a set of digit lines at an end of the array being coupled to a first input of a respective sense amplifier, a second input of the sense amplifier being coupled to an adjacent digit line;

a plurality of load circuits each having an adjustable impedance; and a second plurality of sense amplifiers each having a first input coupled to a respective one of the digit lines at the end of the array and a second input coupled to a respective one of the load circuits;

an address decoder receiving a memory address at an external terminal, the address decoder being operable to activate a row and column in the array corresponding to the memory address; and a data path operable to couple read data from an external terminal to the memory array and write data from the memory array to the external terminal.

27. The memory device of claim 26 wherein each of the load circuits comprises a circuit having an input terminal with an adjustable capacitance.

28. The memory device of claim 26 wherein the load circuit comprises a plurality of capacitors.

29. The memory device of claim 28 wherein each of the capacitors is coupled to the second input of each sense amplifier by a respective MOSFET transistor.

30. The memory device of claim 28 wherein each of the capacitors comprises a memory cell capacitor.

31. The memory device of claim 28 wherein a plurality of MOSFETs coupled to respective ones of the capacitors have respective control terminals that are coupled to each other.

32. The memory device of claim 26 wherein each of the load circuits comprises a plurality of series circuits connected in parallel with each other, each of the series circuits comprising a transistor in series with a capacitive device.

33. The memory device of claim 26 wherein the memory device comprises a dynamic random access memory.

34. The memory device of claim 33 wherein the dynamic random access memory device comprises a synchronous dynamic random access memory.

35. A computer system comprising:
   a processor;
   a peripheral device bus;
   a memory device, comprising
      a memory array having a plurality of sub-arrays, each sub array including a plurality of memory cells arranged in rows and columns;
      a digit line for each column of each sub-array;
      a plurality of sense amplifiers, the digit lines and sense amplifiers being arranged in an open-array architecture so that each of a first plurality of sense amplifiers is coupled to a digit line in each of two adjacent sub-arrays except for a first set of digit lines in at least one end sub-array;
      a second plurality of sense amplifiers each having first and second complimentary inputs, the digit lines in the first set being coupled to the first input of a respective sense amplifier in the second plurality of sense amplifiers;
      a load circuit coupled to the second input of each sense amplifier in the second plurality of sense amplifiers, the load circuit having an adjustable impedance;
      an address decoder receiving a memory address at an external terminal, the address decoder being operable to activate a row and column in the array corresponding to the memory address; and
      a data path operable to couple read data from an external terminal to the memory array and write data from the memory array to the external terminal.

36. The computer system of claim 35 wherein the load circuit comprises a circuit having an input terminal with an adjustable capacitance.

37. The computer system of claim 35 wherein the load circuit comprises a plurality of capacitors.

38. The computer system of claim 37 wherein the resistive device comprises a MOSFET transistor biased to an ON condition.

39. The computer system of claim 37 each of the capacitors is coupled to the second input of each sense amplifier by a respective MOSFET transistor.

40. The computer system of claim 37 wherein each of the capacitors comprise a memory cell capacitor.

41. The computer system of claim 35 wherein the load circuit comprises a plurality of series circuits connected in parallel with each other, each of the series circuits comprising a transistor in series with a capacitive device.

42. The computer system of claim 35 wherein the memory device comprises a dynamic random access memory.

43. The computer system of claim 42 wherein the dynamic random access memory device comprises a synchronous dynamic random access memory.

44. A computer system comprising:
   a processor;
   a peripheral device bus;
   a memory device, comprising
      a memory array comprising:
         a first plurality of sense amplifiers and digit lines arranged in an open array architecture, each digit line in the array except for a set of digit lines at an end of the array being coupled to a first input of a respective sense amplifier, a second input of the sense amplifier being coupled to an adjacent digit line;
         a plurality of adjustable load circuits; and
         a second plurality of sense amplifiers each having a first input coupled to a respective one of the digit lines at the end of the array and a second input coupled to a respective one of the load circuits;
      an address decoder receiving a memory address at an external terminal, the address decoder being operable to activate a row and column in the array corresponding to the memory address; and
      a data path operable to couple read data from an external terminal to the memory array and write data from the memory array to the external terminal;
   a bus bridge coupling the processor to the memory device and the peripheral device bus;
   an input device coupled to the peripheral device bus;
   an output device coupled to the peripheral device bus; and
   a mass storage device coupled to the peripheral device bus.

45. The computer system of claim 44 wherein each of the load circuits comprises a circuit having an input terminal with an adjustable capacitance.

46. The computer system of claim 44 wherein the load circuit comprises a plurality of capacitors.

47. The computer system of claim 46 wherein each of the capacitors is coupled to the second input of each sense amplifier by a respective MOSFET transistor.

48. The computer system of claim 46 wherein each of the capacitors comprises a memory cell capacitor.

49. The computer system of claim 46 wherein plurality of MOSFETs coupled to respective ones of the capacitors have respective control terminals that are coupled to each other.

50. The computer system of claim 44 wherein each of the load circuits comprises a plurality of series circuits connected in parallel with each other, each of the series circuits comprising a transistor in series with a capacitive device.

51. The computer system of claim 44 wherein the memory device comprises a dynamic random access memory.

52. The computer system of claim 51 wherein the dynamic random access memory device comprises a synchronous dynamic random access memory.

53. In a memory array having an open array architecture in which a plurality of digit lines at the end of the array that are unconnected to a sense amplifier and are thus unused, a method of using the digit lines, comprising:
   coupling each of the digit lines to one input of a respective sense amplifier; and
   coupling a second input of the sense amplifier to a simulated capacitance.

54. The method of claim 53, further comprising:
   testing the memory array to determine if each of two inputs to a sense amplifier have substantially the same capacitance; and
   adjusting the capacitance of the simulated capacitance based on the testing.

* * * * *